(12) United States Patent
Chang et al.

(10) Patent No.: US 6,667,888 B1
(45) Date of Patent: Dec. 23, 2003

(54) CASSETTE STRUCTURE WITH A CARD CONNECTOR

(75) Inventors: Cheng-Tsai Chang, Yungho (TW); Chin-Fa Lee, Taoyuan Hsien (TW); Chun-Chih Huang, Tainan (TW)

(73) Assignees: Teconn Electronics Inc., Taipei Hsien (TW); Four Dimension Industrial Corp., Taipei Hsien (TW)

( * ) Notice: Subject to any disclaimer, the term of this patent is extended or adjusted under 35 U.S.C. 154(b) by 0 days.

(21) Appl. No.: 10/224,611

(22) Filed: Aug. 21, 2002

(51) Int. Cl.[7] ................................................. H05K 1/14
(52) U.S. Cl. ..................... 361/737; 361/760; 361/740; 361/802; 361/686; 361/752; 257/99
(58) Field of Search ................................. 361/737, 760, 361/720, 740, 752, 797, 748, 801, 802, 686, 724, 800, 730, 714, 796; 257/99; 455/347; 348/836

(56) References Cited

U.S. PATENT DOCUMENTS 4,868,714 A * 9/1989 Banjo et al. ................. 361/737
6,191,950 B1 * 2/2001 Cox et al. .................... 361/737

* cited by examiner

Primary Examiner—David Martin
Assistant Examiner—Hung Bui
(74) Attorney, Agent, or Firm—Bacon & Thomas, PLLC

(57) ABSTRACT

A structure of the cassette with a card connector is disclosed. The cassette comprises a chassis, an upper metallic board, a lid, and a bottom metallic board. The upper metallic board is detachably mounted onto the top of the chassis by engaging a plurality of fitting elements of the upper metallic board with the receiving cavities and slots of the chassis. The slot of the lid is slid into the groove of the chassis, until the protruded shafts of the lid fits into the corresponding receiving cavities on the chassis, and a front part of the lid stacks on a distal plate of the upper metallic board for securely coupling the upper metallic board onto the chassis. Thus, the present invention not only allows the repair, or replacement of parts of the PCB, or the replacement of the PCB, but also reuse of the parts of the cassette.

5 Claims, 8 Drawing Sheets

# CASSETTE STRUCTURE WITH A CARD CONNECTOR

BACKGROUND OF THE INVENTION

1. Filed of the Invention

The present invention generally relates to a Cassette structure with card connector, and more particularly to a cassette structure comprising a lid and an upper metallic board detachably mounted onto a chassis of a case, encompassing a printed circuit board, allowing easy disassembly of the lid and the upper metallic board from the top of the case for easy maintenance and replacement of parts of the printed circuit board. Therefore this invention provides a scheme of easy assembly of parts, prompt maintenance and reuse of assembly parts.

2. Description of the Related Art

Due to the rapid advancement in computer and information technologies, nowadays desktop and notebook computers are very popular. The users can link up with the internet to retrieve and transmit information by using computers. The information technology network provides great service and convenience to the users and it has become an essential resource for individuals at home and as well as for companies. In order to link up with the network, a variety of electrical connectors has been disclosed for use in different computers and the telephone line, for example, a desk computer requires an electrical connector for the cable connection, and a notebook computer requires a network card connector. The network card connector is typically inserted into the card connector cassette which comprises a housing encompassing a printed circuit board of the notebook computer. The card connector cassette is suitable for connecting PCMICA, CF card, or the memory chip of PDA and digital camera.

Conventional cassette structure as illustrated in FIGS. 8 through 10, comprises a plurality of projection elements disposed two sides of a metallic plate A. Each projection element comprises as first folded side A1, a second folded side A2, and a slot A3 in the second folded side A2, for securing the metallic plate A between an upper case B and bottom case C and encompassing a printed circuit board (PCB) D. A protruded element B1 is disposed on the connecting surface below the upper case B, and a cavity C1 is disposed on the top of the bottom case C corresponding to the protruded element B1. The inner side of the cavity C1 facing the protruded element B1 forms a primary angle C11 and in contact with an edge B11 of protruded element B1 of upper case B. The upper case B and bottom case C are welded together as a one-piece.

The above card-connector cassette structure allows the metallic plate a secure joint with the PCB, and securing it from parting from the metallic plate. However, it would be difficult to remove the PCB from the above cassette structure when the parts of the PCB need a replacement. In other words, in order to access to parts of the PCB or and remove the PCB, the card-connector cassette has to be destroyed. As a result, the maintenance cost of card-connector cassette is high. Therefore, the need for a cost effective card connector cassette is highly desirable.

SUMMARY OF THE INVENTION

Accordingly, in the view of the foregoing, the present inventor makes a detailed study of related art to evaluate and consider, and uses years of accumulated experience in this field, and through several experiments, to create a cassette structure with a card connector of the present invention. The present invention provides a cost effective cassette structure with a card connector, which allows easy maintenance, repair, or replacement of PCB, without requiring the destruction of the case main body. The cassette structure of present invention also allows the reuse of, for example, the case, the lid and the upper metallic board.

In order to achieve the above objects and other objects of the present invention, a cassette structure with a card connector is provided. The cassette structure with card connector comprises, a chassis, comprising a plurality of slots formed thereon, a lid, comprising a plurality of fitting elements, and an upper metallic board, comprising a plurality of fitting elements, wherein the lid and the upper metallic board are detachably mounted onto the chassis. The upper metallic board is placed over the case, wherein the fitting elements of the upper metallic board are aligned onto the slots of the case, and then fitting elements are engaged into the slots to secure the upper metallic board on top of chassis. Thus the upper metallic board is detachably mounted onto the case, and the upper metallic board can be detached from the case by disengaging fitting elements of the upper metallic board from the slots of the chassis. The lid is detachable slid onto the case by slideably engaging slots of the fitting elements with grooves which are located on the corresponding two external side surface of the chassis. Therefore the internal parts of the cassette of the present invention can be easily accessed in need of replacements or maintenance without destroying the cassette.

According to one aspect of the present invention, the slot of the lid can be detachably slid into grooves of a chassis, and a front part of the lid can be engageably stacked-on distal part of the upper metallic plate, by sliding from a rear part of the upper metallic board, and tightly securing the upper metallic board with the case.

According to another aspect of the present invention, a plurality of L-shaped slots are disposed on an inner surface of two sides of the case. The L-shaped slot at an .upper portion serves as an input slot and a bottom portion thereof serves as a securing slot. The fitting elements of the upper metallic board is engaged into the input slots and then slid into the securing slots, to secure the upper metallic plate with the case.

DESCRIPTION OF THE PREFERRED EMBODIMENTS

Figure 1:
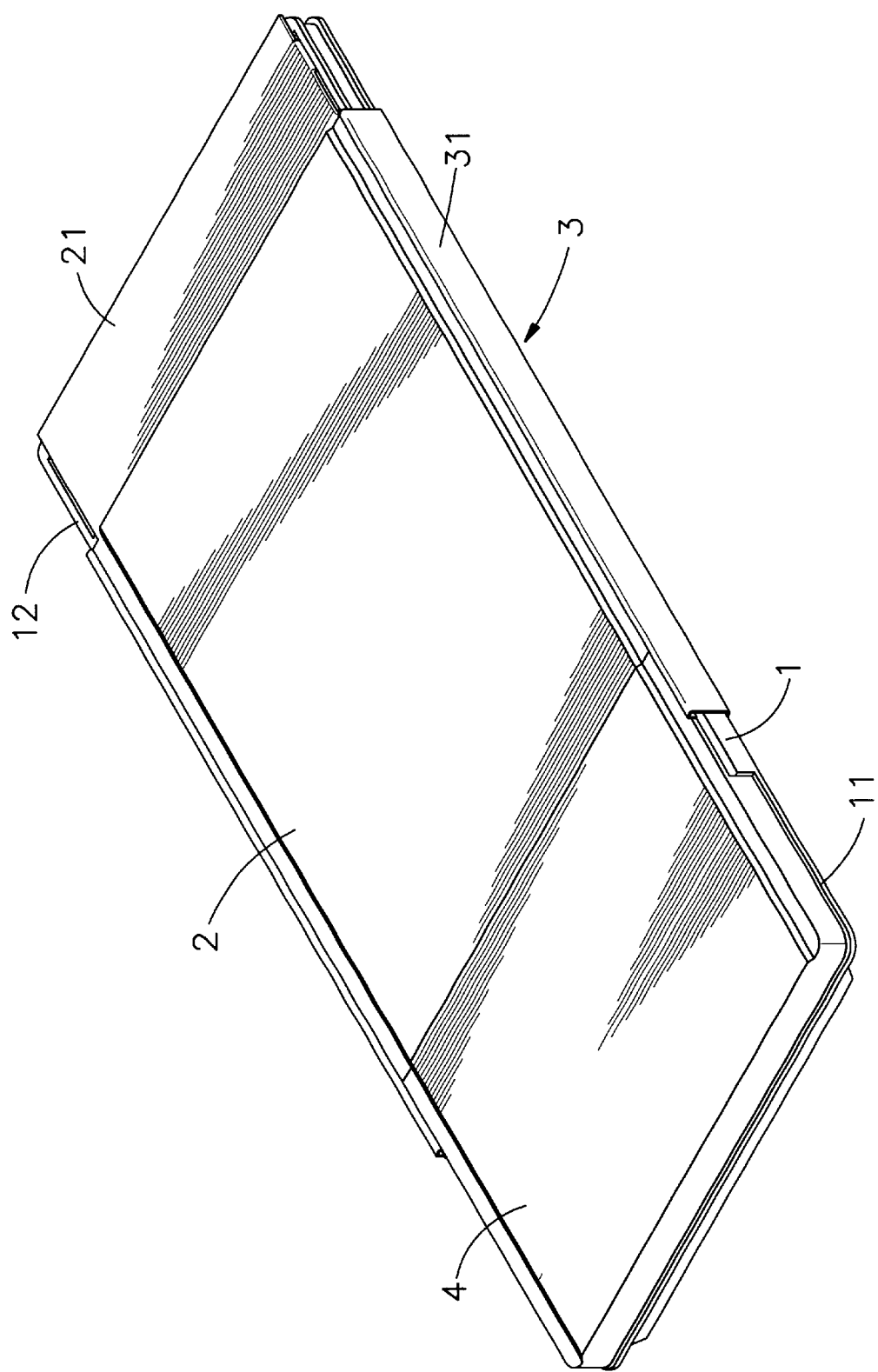
FIG. 1 is a is an elevational view of a cassette structure with a card connector in according to a preferred embodiment of the present invention.

Reference will be made in detail to the preferred embodiments of the invention, examples of which are illustrated in the accompanying drawings. Wherever possible, the same reference numbers are used in the drawings and the description to refer to the same or like parts.

Figure 2:
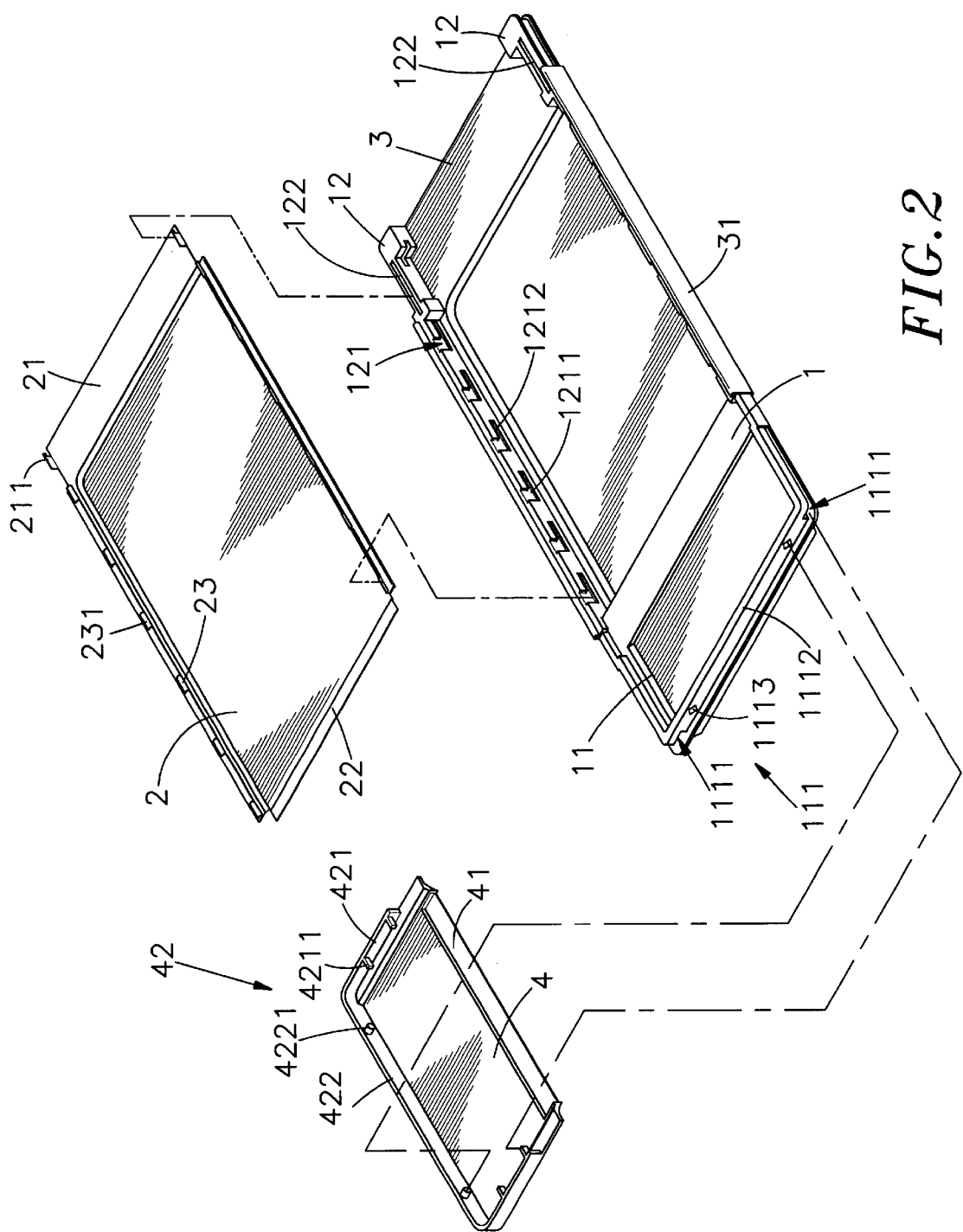
FIG. 2 is an exploded view of a cassette structure with a card connector according to a preferred embodiment of the present invention.
Figure 3:
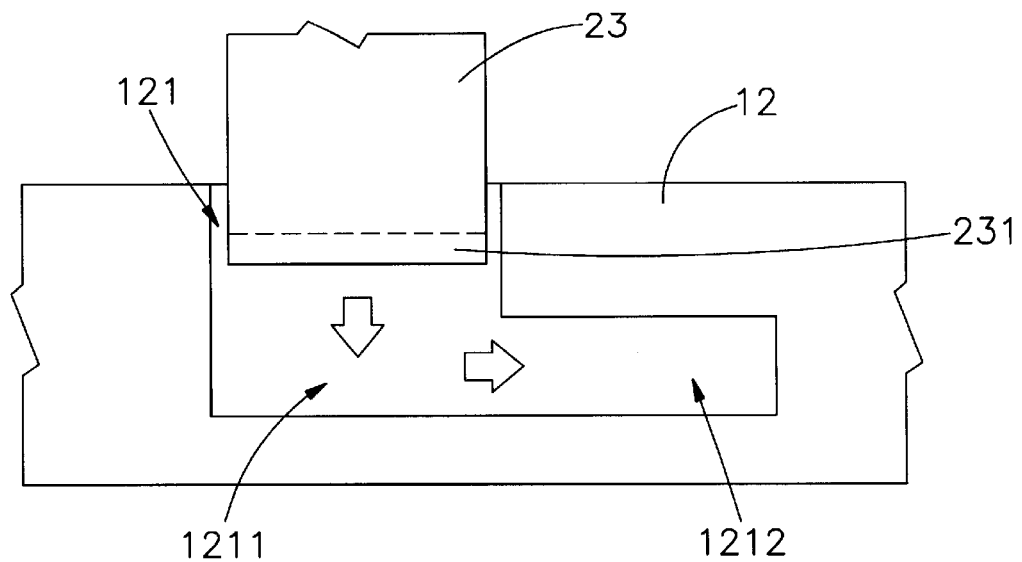
FIG. 3 is a sectional view showing an engaging step of fitting elements of an upper metallic board into the slots of a case according to a preferred embodiment of the present invention.

For a more complete understanding of the present invention, reference will now be made to the following detailed description of preferred embodiments taken in conjunction with the accompanying drawings, in which:

Referring to FIGS. 1, 2, and 3, show a cassette structure with card connector of the present invention. The cassette 1 comprises a chassis 11, an upper metallic board 2, a bottom metallic board 3 and a lid 4. The chassis 11 comprises a support arm 12 located on a first side and a second side, and a plurality of fitting elements 111 on the other end portion opposite to the support arm 12, and on an external surface of a third side of the chassis 11. The fitting elements 111 comprises a groove 1111, extending from an rear corner on an external surface of the first side and the second side, opposite to the support arm 12, and a plurality of receiving cavities 1113 on an external surface of a rear side of the chassis 11. A plurality of L-shaped slots 121 are disposed on a inner surface of the support arms 12 of the chassis 11, wherein each slot 121 further comprises a input slot 1211 at an upper portion, and a securing slot 1212 at a bottom portion. The arm 12 of the chassis 11 further comprises a receiving cavity 122, located near a front portion formed thereon.

The upper metallic board 2 is detachably mounted onto the support arms 12 of the chassis. 11, wherein a protruded fitting element 211 extending from a first side and a second-side of a front part 21 of the upper metallic board 2 are engaged into the receiving cavity 122 of the arm 12 of the chassis 11, and a plurality of fitting element 23 which are located and extending from a first side and a second side of a fitting board 231 of the upper metallic board 2, are detachably engaged into the L-shaped slots 121 of the support arm 12 of the chassis 11.

Figure 4:
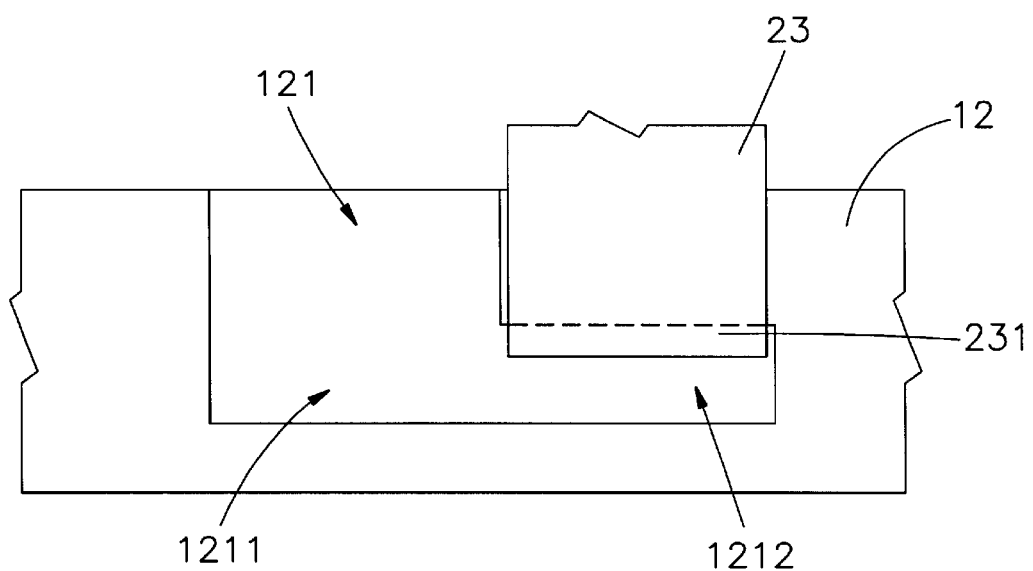
FIG. 4 is a sectional view showing engagement of fitting elements of an upper metallic board into the slots of a case according to a preferred embodiment of the present invention.
Figure 5:
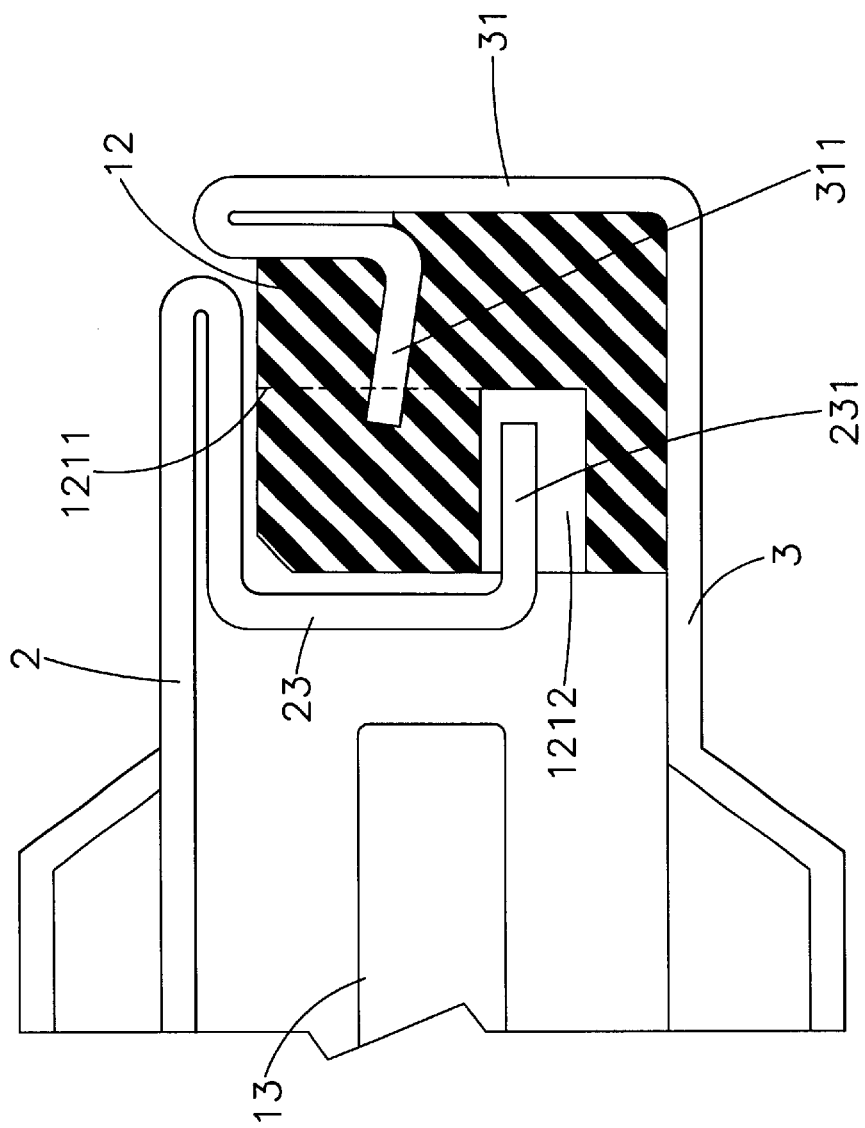
FIG. 5 is a sectional view showing engagement of a bottom metallic board into with a case according to a preferred embodiment of the present invention.

The bottom metallic board 3 is located under the chassis 11. The bottom metallic plate 3 comprises a side arm 31 extending from a first side and a second side, covering a side external surface of the support arm 12 of the chassis 11, wherein a distal end portion forms a clipping arm 311 to clip the chassis 11 (as shown in FIGS. 3, 4, and 5).

The lid 4 is detachably slid into position on the top of the chassis 11 of the case 1. The lid 4 comprises a groove 41, located at a front part of the lid 4, a plurality of fitting elements 42. The fitting elements 42 comprises a plurality of elevated bars 4211 extending from an inner surface of the first and second side 421 of the lid 4. A plurality of protruded shafts 4221 extending from a inner side of a rear side 422, for holding the lid 4 in firm position with the chassis 11.

As described above, the bottom metallic board 3, is disposed under the chassis 11, with its side arms 31 surrounding the first side and the second side of the chassis 11, and wherein a distal portion of the side arm 31 which forms a clipping 311 is attached with the chassis 11 as one integral piece. The upper metallic board 2 is mounted onto the top of the chassis 11 by aligning the protruded fitting element 211 of the upper metallic board 2 with the receiving cavity 122 of the support arm 12, and pressing the upper metallic board 2 against the chassis 11 in order to engage the fitting elements 231 of the upper metallic board 2 into the corresponding input slots 1211 of the support arm 12 of the chassis 11, and to engage the protruded fitting element 211 with the receiving cavity 122 of the support arm 12 of the chassis 11. Next, the upper metallic board 2 is pushed to a certain distance to slide and engage the fitting board 231 into the securing slot 1212, and to further engage the protruded fitting element 211 with the receiving cavity 122 at the same time. Thus, the upper metallic board 2 is detachably coupled with the chassis 11. Next, the slot of the lid 4 is slid into the groove 1111 of the chassis 11, from a rear board 1112 of the chassis 11 of the cassette 1, until the protruded shafts 4221 of the lid 4 fits into the corresponding receiving cavities 1113 of the chassis 11, and the groove 41 of the lid 4 slideably stacks on an upper groove part of the distal portion 22 of the upper metallic board 2, for securely coupling the upper metallic board 2 onto the chassis 11.

Figure 6:
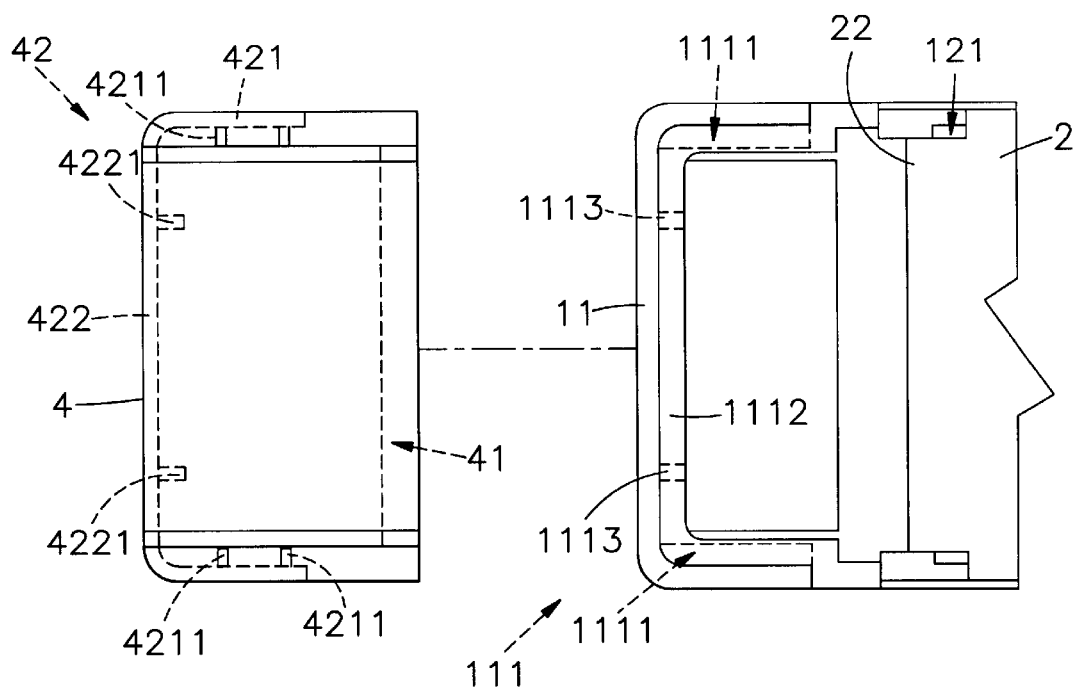
FIG. 6 is a top view showing of the lid and a sectional view of the chassis of the case before the engagement of the lid with the chassis of the case, according to a preferred embodiment of the present invention.
Figure 7:
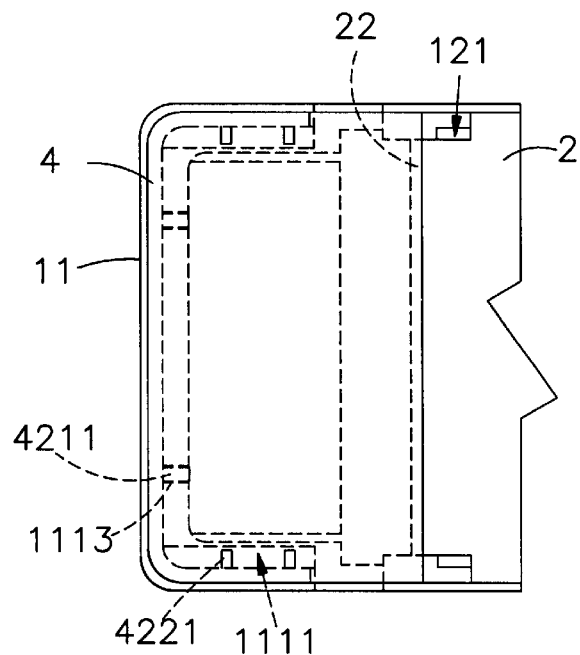
FIG. 7 is a top view showing the engagement of the lid onto the case according to a preferred embodiment of the present invention.
Figure 8:
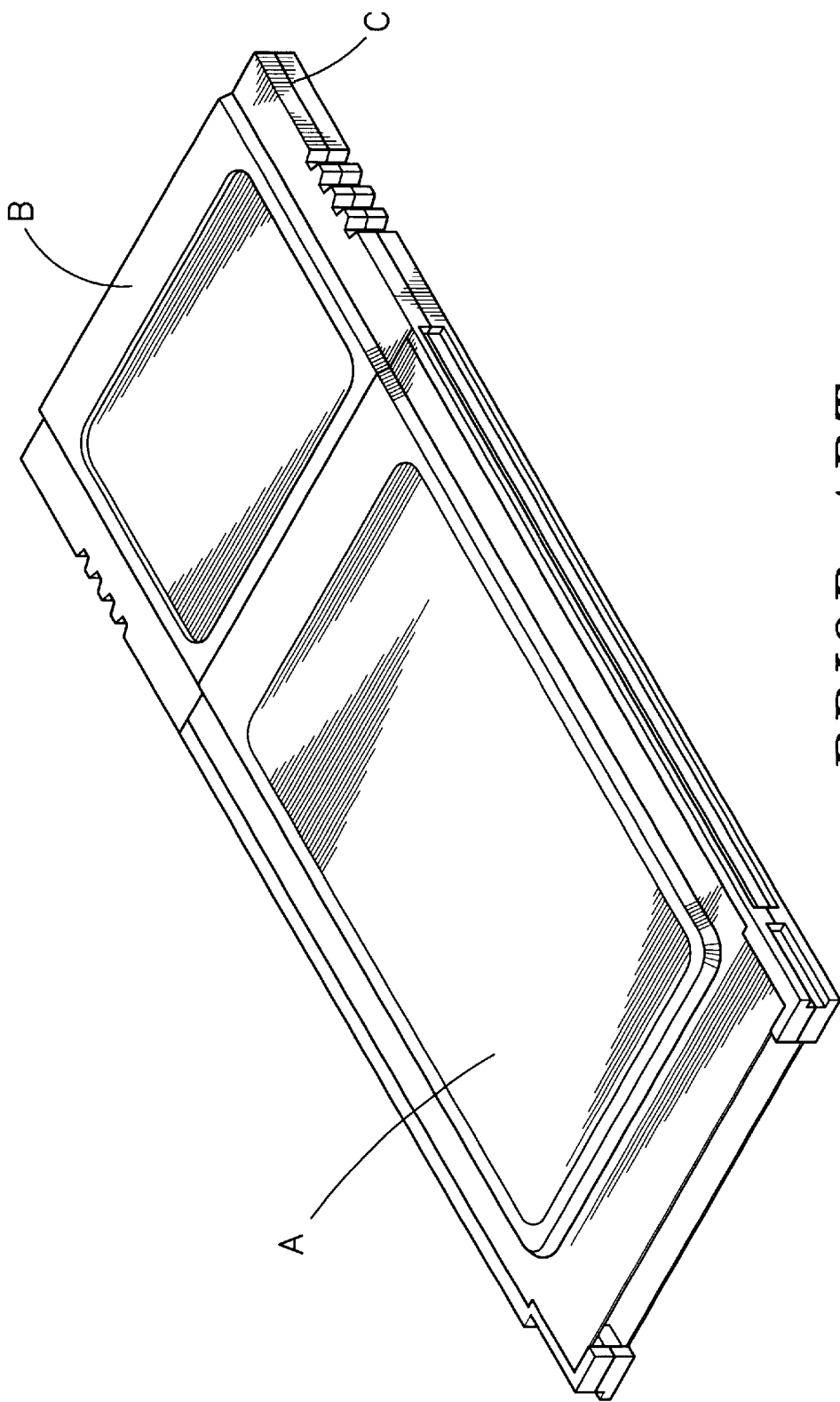
FIG. 8 is an elevational view of a conventional cassette structure with a card connector.
Figure 9:
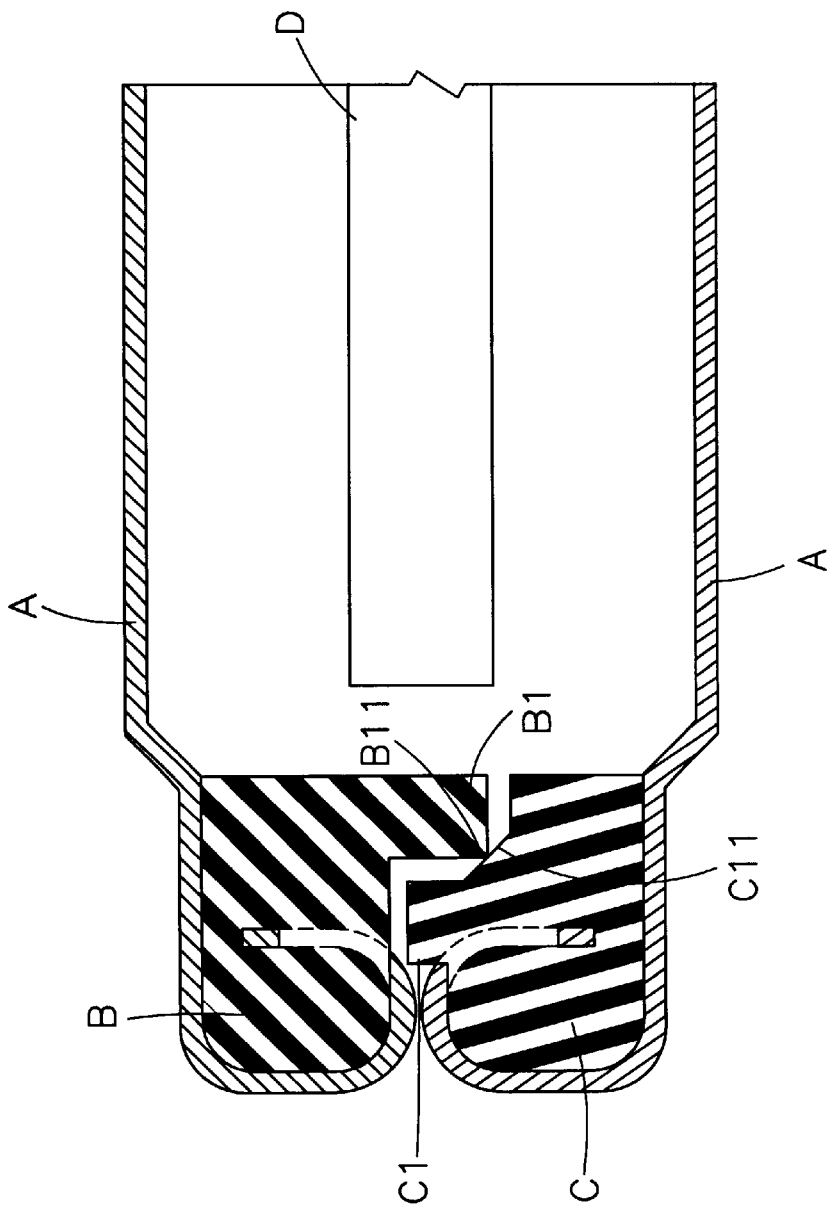
FIG. 9 is a sectional side view of the conventional cassette structure with a card connector.
Figure 10:
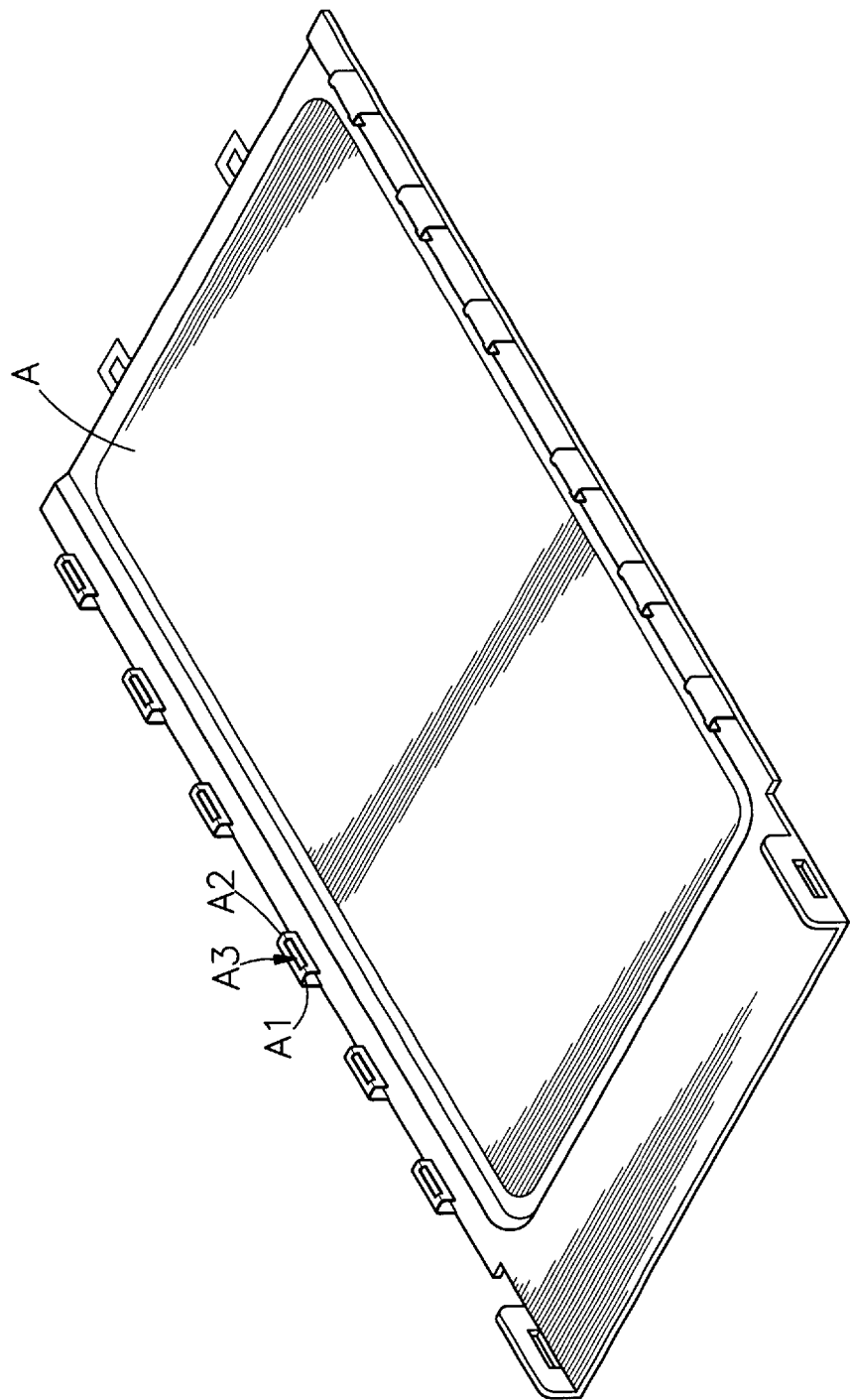
FIG. 10 is an elevational view of the conventional metallic plate.

Referring to the FIGS. 6 and 7, show a top view of before and after the lid 4 is slid over the chassis 11 of the case 1 of the present invention. The fitting elements 111 of the chassis 11 of the case 1 comprises a groove 1111 on a first side and a second side of the chassis 11, and an external surface of a rear side 1112 of the chassis 11 comprises a plurality receiving cavities 1113. The fitting element 42 of the lid 4 comprises a slot disposed on an internal surface of a first side and a second side of the lid 4, a plurality of elevated bars 4211 disposed below the slot, extending from an internal surface of the first side and the second side 421 of the lid 4, and a plurality of protruded shafts 4221 disposed extending from an inner surface of the rear side 422. When the lid 4 is slid by slideably engaging the sliding slots with the groove 1111 of the chassis 11 into the side board 421 of the lid 4, the chassis 11 will be fitted in between the elevated bar 4211 and the slot of the lid 4, and the protruded shafts 4221 of the rear side 422 of the lid 4 will fit into receiving cavities 1113 of the rear board 1112 of the chassis 11, to securely couple the lid 4 onto the chassis 11.

As described above, the protruded shafts 4221 of lid 4 tightly fit into the receiving cavities 1113 of the chassis 11, and the groove 41 of the lid 4 is firmly mounted on a distal portion 22 of the upper metallic board 2, therefore the lid 4 is securely coupled to the upper metallic board 2 with the chassis 11 as one integral piece.

Referring to FIGS. 5, 6, and 7, the cassette 1 encompasses a PCB 13. When the PCB 13 needs repair, or replacement of parts, or replacement of PCB 13 itself, then the lid 4 is slid on the reverse direction, in a direction opposite to the chassis 11, to release the groove 41, the elevated bars 4221, the protruded shafts 4211, and the slot of the lid 4 from the distal portion 22 of the upper metallic plate 2, the groove 1111, and the receiving cavities 1113 of the chassis 11, respectively. Next, the upper metallic board 2 is released from the chassis 11 by disengaging the fitting elements 23 of the upper metallic plate 2 from the L-shaped slots 121 of the support arm 12, and disengaging the protruded fitting element 211 of the upper metallic plate 2 from the receiving cavities 122 of the chassis 11. Thus, the PCB 13 can be easily accessed for repair, replacements of parts or replacements of the PCB 13 itself without destructing the cassette 1.

After repair, or replacement of parts, or replacement of the PCB 13, the upper metallic plate 2 and the lid 4 are reassembled back to securely couple with the chassis 11 as follows. The upper metallic board 2 is mounted onto the top of the chassis 11 by aligning the protruded fitting element 211 of the upper metallic board 2 with the receiving cavity 122 of the support arm 12, and pressing the upper metallic board 2 against the chassis 11 in order to engage the fitting elements 231 of the upper metallic board 2 into the corresponding input slots 1211 of the support arm 12 of the chassis 11, and to engage the protruded fitting element 211 with the receiving cavity 122 of the support arm 12 of the chassis 11. Next, the upper metallic board 2 is pushed to a certain distance to slide and engage the fitting board 231 into the securing slot 1212, and to further engage the protruded fitting element 211 with the receiving cavity 122 at the same time. Thus, the upper metallic board 2 is detachably coupled with the chassis 11. Next, the slot of the lid 4 is slid into the groove 1111 of the chassis 11, from a rear board 1112 of the chassis 11 of the cassette 1, until the protruded shafts 4221 of the lid 4 fits into the corresponding receiving cavities 1113 of the chassis 11, and the groove 41 of the lid 4 slideably stacks on a distal plate 22 of the upper metallic board 2 for securely coupling the upper metallic board 2 onto the chassis 11. Thus, the present invention not only allows the repair, or replacement of parts of the PCB, or the replacement of the PCB, but also reuse of the parts of the cassette 1. Thus, the present provides a cost effective and simple structure for a cassette with a card connector.

While the invention has been described in conjunction with a specific best mode, it is to be understood that many alternatives, modifications, and variations will be apparent to those skilled in the art in light of the a foregoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

What the claimed is:

1. A cassette structure with a card connector encompassing a printed circuit board (PCB), the cassette structure comprising:
    a chassis, comprising a first support arm on a first side and a second support arm on a second side, a plurality of slots disposed on an inner surface of the first support arm and the second support arm;
    an upper metallic board, detachably mounted onto the chassis, comprising a plurality of fitting elements extending downwardly from a first side, engaged into the slots of the first support arm, and a plurality of fitting elements extending downwardly from a second side, engaged into the slots of the second support arm, and an upper groove part forming a rear plate on a rear side of the upper metallic plate;
    a bottom metallic board, disposed under the chassis, integrally formed as one piece with said chassis; and
    a lid, detachably slid onto the chassis, comprising an inner groove part secured to the upper groove part of the upper metallic plate, and a plurality of fitting elements for detachably coupling with the chassis,
    wherein the slots of said first support arm and the second support arm comprise L-shaped slots, and wherein each of the L-shaped slots further comprises an input slot located on an upper side and a securing slot located on a lower side.

2. The cassette structure according to claim 1, wherein said first support arm and said second support arm further comprise a receiving cavity on a frontal end to receive and couple with a protruded fitting element located on a corresponding position on the upper metallic board.

3. The cassette structure according to claim 1, wherein said bottom metallic board comprises a pair of folded arms covering a surface of the first and second support arms of the chassis, and distal portion of the each folded arm forms a fitting clip to clip securely with the chassis.

4. cassette structure with a card connector encompassing a printed circuit board (PCB), the cassette structure comprising:
    a chassis, comprising a first support arm on a first side and a second support arm on a second side, a plurality of slots disposed on an inner surface of the first support arm and the second support arm;
    an upper metallic board, detachably mounted onto the chassis, comprising a plurality of fitting elements extending downwardly from a first side, engaged into the slots of the first support arm, and a plurality of fitting elements extending downwardly from a second side, engaged into the slots of the second support arm, and an upper groove part forming a rear plate on a rear side of the upper metallic plate;
    a bottom metallic board, disposed under the chassis, integrally formed as one piece with said chassis; and
    a lid, detachably slid onto the chassis, comprising a an inner groove part seed secured to the upper groove part of the upper metallic plate, and a plurality of fitting elements for detachably coupling with the chassis,
    wherein the lid further comprises a sliding slots on a first side and a second side, a plurality of elevated bars disposed below the sliding slots, said bars extending from an inner surface of said first and second sides, and a plurality of protruded shafts extending from an inner surface of a rear side of the lid.

5. The cassette structure according to claim 4, wherein the chassis further comprises a groove on an external surface of the first side and the second side opposite to the first and second support arms, for receiving said sliding slots of the lid, and plurality of receiving cavities on a rear side surface for receiving and coupling with said protruded shafts of the lid.

* * * * *